US011094967B2

(12) United States Patent
Biggs, Jr.

(10) Patent No.: US 11,094,967 B2
(45) Date of Patent: Aug. 17, 2021

(54) INTEGRATED SYSTEM AND METHOD FOR DESULFATING AND COMMUNICATING THE CONDITION OF A BATTERY

(71) Applicant: CANADUS POWER SYSTEMS, LLC, Twinsburg, OH (US)

(72) Inventor: Daniel C. Biggs, Jr., Reminderville, OH (US)

(73) Assignee: CANADUS POWER SYSTEMS, LLC, Twinsburg, OH (US)

(*) Notice: Subject to any disclaimer, the term of this patent is extended or adjusted under 35 U.S.C. 154(b) by 108 days.

(21) Appl. No.: 16/229,944

(22) Filed: Dec. 21, 2018

(65) Prior Publication Data

US 2019/0207266 A1    Jul. 4, 2019

Related U.S. Application Data

(60) Provisional application No. 62/611,022, filed on Dec. 28, 2017.

(51) Int. Cl.
*H01M 10/42* (2006.01)
*H01M 10/48* (2006.01)
(Continued)

(52) U.S. Cl.
CPC ........ *H01M 10/425* (2013.01); *G01R 31/005* (2013.01); *G01R 31/374* (2019.01); *G01R 31/3842* (2019.01); *H01M 10/06* (2013.01); *H01M 10/4242* (2013.01); *H01M 10/48* (2013.01); *H01M 10/486* (2013.01);
(Continued)

(58) Field of Classification Search
None
See application file for complete search history.

(56) References Cited

U.S. PATENT DOCUMENTS 5,648,714 A       7/1997   Eryou et al.
2008/0246440 A1  10/2008  Altman
(Continued)

FOREIGN PATENT DOCUMENTS

WO       2017/083711       5/2017

OTHER PUBLICATIONS

PCT, International Search Report and Written Opinion, PCT/US2018/067164 (dated Mar. 5, 2019).
(Continued)

*Primary Examiner* — Stewart A Fraser
(74) *Attorney, Agent, or Firm* — Thompson Hine LLP

(57) ABSTRACT

An integrated system for desulfating and communicating a condition of a battery includes a desulfator that can be connected to the battery to sense one or more of a voltage across a positive terminal and a negative terminal of the battery, a current of the battery, and a temperature of the battery; the desulfator further including a source of desulfation energy that can be connected to the battery for delivering pulsation energy at predetermined frequencies and durations; and a system control for actuating the source of desulfation energy, and connected to receive data indicative of a real-time condition of the battery from the sensed one or more of the voltage across the positive and the negative terminals of the battery, the current of the battery, and the temperature of the battery, and transmit the data indicative of the real-time condition of the battery.

22 Claims, 1 Drawing Sheet

(51) Int. Cl.
*G01R 31/3842* (2019.01)
*G01R 31/00* (2006.01)
*G01R 31/374* (2019.01)
*H01M 10/06* (2006.01)

(52) U.S. Cl.
CPC .............. *H01M 2010/4271* (2013.01); *H01M 2010/4278* (2013.01); *H01M 2220/20* (2013.01)

(56) References Cited

U.S. PATENT DOCUMENTS

| | | |
|---|---|---|
| 2009/0206796 A1 | 8/2009 | Pacholok et al. |
| 2010/0013439 A1 | 1/2010 | Altman |
| 2010/0019773 A1* | 1/2010 | Son .................... H01M 10/443 324/431 |
| 2014/0225555 A1 | 8/2014 | Biggs |

OTHER PUBLICATIONS

EP, Extended European Search Report; European Patent Office; Patent Application Serial No. 18895118.0; 9 pages (dated Jan. 27, 2021).

* cited by examiner

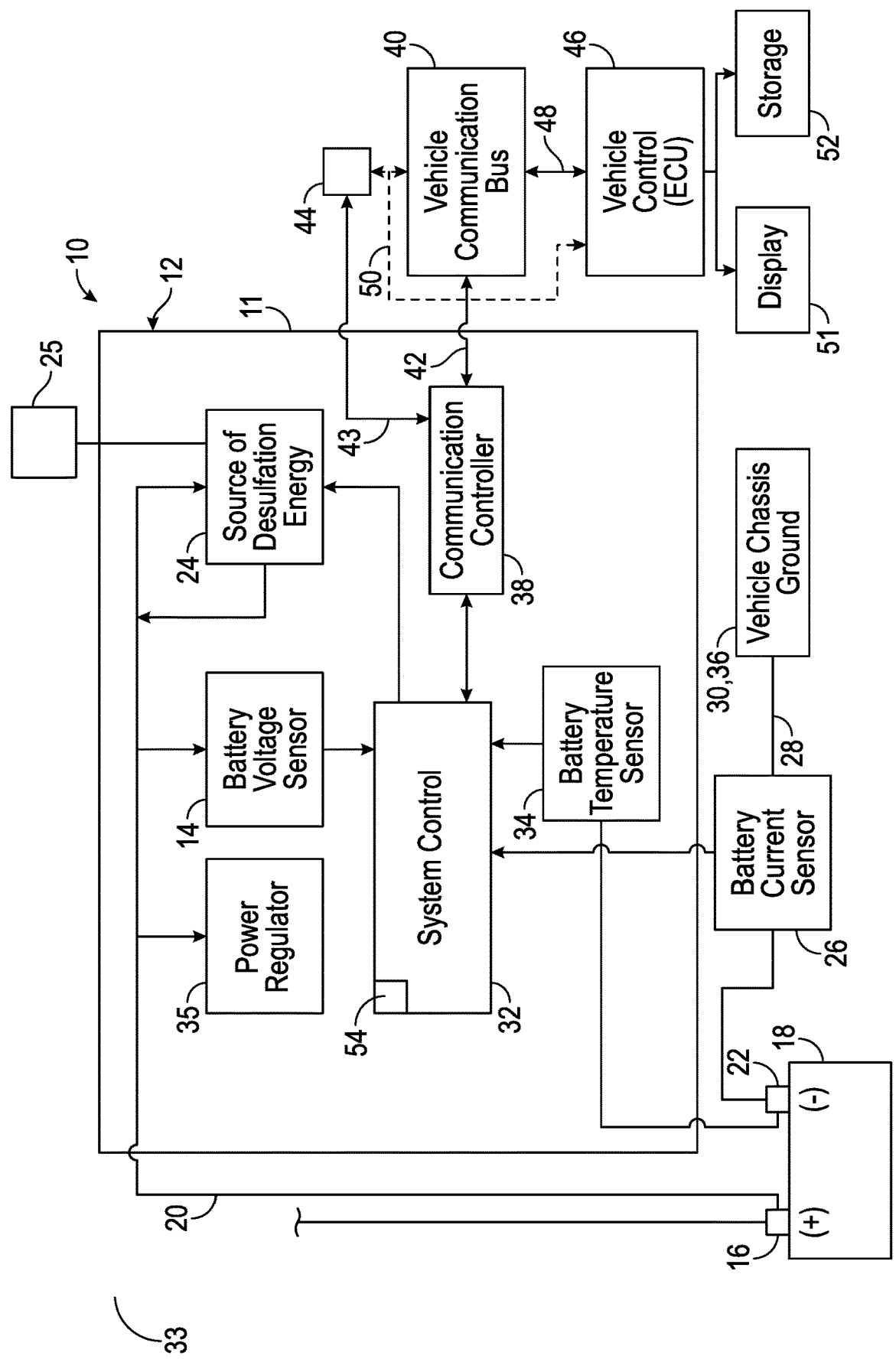

INTEGRATED SYSTEM AND METHOD FOR DESULFATING AND COMMUNICATING THE CONDITION OF A BATTERY

TECHNICAL FIELD

The present disclosure relates to systems and methods for reconditioning batteries, and more particularly, to integrated systems and methods for desulfating batteries and transmitting a condition of the battery.

BACKGROUND

Lead-acid batteries generate electricity through a double sulfate chemical reaction. Lead and lead dioxide, the active materials in the plates of a lead-acid battery, react with a sulfuric acid electrolyte to form lead sulfate during battery discharge. The lead sulfate reverts to lead, lead dioxide, and sulfuric acid when the lead-acid battery is recharged by running a current from the negative plate to the positive plate.

Sulfation is the creation of a stable, crystalline form of lead sulfate that is deposited on the plates of a lead-acid battery and impedes the complete recharging of the battery. Sulfation can result from insufficient charging of lead-acid batteries. Sulfation also may occur gradually as a result of repeated cycles of charging and discharging. Sulfation increases the internal resistance of a lead-acid battery and reduces the normal discharge amount, lengthens the time required to recharge, and increases battery operating temperature. If sufficient sulfation is present in a lead-acid battery, the battery may short circuit.

Desulfation is the process of reversing the sulfation of a lead-acid battery, by removing the crystalline deposits of lead sulfate from the battery plates. Desulfation can be effected by providing high-current pulses between the terminals of a lead-acid battery, which are believed to break down the sulfate crystals that have formed on the battery plates. Electronic desulfation devices ("EDDs") have been developed that apply pulses of desulfation energy, such as radio frequency energy, to the battery terminals.

One type of EDD is powered by the lead-acid battery it is connected to desulfate. In that arrangement, the battery powers both the EDDs' electronic circuitry and delivers the energy required to desulfate the battery. The EDDs' electronic circuitry often requires protection from the environment, and thus is typically sealed inside an enclosure. With many applications of such EDDs, the battery to be desulfated is at a remote location, such as in a well field, or the battery is located in a vehicle in a hard-to-reach spot. In both instances, taking measurements of various battery conditions, such as the state of health of the battery, the state of charge of the battery, and the state of function of the battery, may be difficult and costly, and require disconnecting the battery or adjacent components to access the battery. Further, frequently there are severe space constraints that limit the size and types of battery desulfating and monitoring equipment that may be attached to a battery.

Accordingly, there is a need for an integrated system and method for desulfating and communicating the condition of a battery. There is also a need for an integrated system that communicates the condition of a battery to a user of the integrated system, a computer, or to other devices, either associated with the vehicle to which the battery is connected or remote from it. Such an integrated system would require less space than a separate desulfator and sensor system, and would be less costly to fabricate and install than two separate systems.

SUMMARY

This disclosure describes an integrated system and method for desulfating and communicating the condition of a battery, and more particularly, an integrated system and method for desulfating and communicating the condition of a battery in real time. The battery may be integrated into a stationary power system, or mounted on a vehicle, which in embodiments includes a land vehicle, a marine vehicle, an amphibious vehicle, an aircraft, and a spacecraft. An advantage of the disclosed system is that it provides a desulfator with a control that senses and collects, optionally stores, and transmits data relating to the condition the battery, which in exemplary embodiments includes one or more of the state of health of the battery, the state of charge of the battery, and the state of function of the battery. In other embodiments, a single system control actuates the source of desulfation energy and causes the desulfator to transmit the collected vehicle battery data to a vehicle electronic control unit.

In still other embodiments, the system control of the integrated system is programmed to receive commands, such as from an electronic control unit of a vehicle in which the system is mounted, for the system control to do one or more of actuate the source of desulfation energy, take measurements of battery voltage, current, and/or temperature, and receive a time to actuate the source of desulfation energy and take the measurements.

The collected vehicle battery data optionally is transmitted from the desulfator to an electronic control unit (ECU) through a communication controller to a communication bus, such as a vehicle control area network (CAN) and/or a local interconnect network (LIN), and/or is transmitted by wire or wirelessly. This combination facilitates control and programming of the desulfator, which may be in response to a battery condition, such as battery temperature that is sensed by the system, and/or a logged number of duty cycles or service time of the battery. In other embodiments, the control and programming may be, or in addition may be, in response to external conditions, such as vehicle activity or inactivity.

Other objects and advantages of the disclosed integrated system and method for desulfating and communicating the condition of a battery will be apparent from the following description, the accompanying drawing, and the appended claims.

BRIEF DESCRIPTION OF THE DRAWING

FIG. 1 is a schematic layout of an embodiment of the disclosed integrated system for desulfating and communicating the condition of a battery.

DETAILED DESCRIPTION

In the exemplary embodiment of FIG. 1, the disclosed integrated system for desulfating and communicating a condition of a battery, generally designated 10, may be enclosed within a desulfator housing 11. The system 10 includes a desulfator 12 having a source of desulfation energy 24 and a battery voltage sensor 14 that can be connected to the positive terminal 16 of a battery 18 by a cable 20. The battery voltage sensor 14 senses a voltage across the positive terminal 16 and the negative terminal 22 of the battery 18. In embodiments, the battery 18 may take the form of a lead-acid battery, and in particular a vehicle battery, a marine battery, an aircraft battery, a spacecraft battery, or a battery for a stationary power source. In embodiments, the battery 18 may be a lead-acid battery of the wet cell, gel, or absorbed glass mat (AGM) variety.

The source of desulfation energy 24 is connected to the battery 18 for delivering pulsation energy at predetermined frequencies and durations sufficient to desulfate the plates of the battery. In an exemplary embodiment, the desulfator 12, and in particular the source of desulfation energy 24, is connected to receive power to operate from the battery 18 over cable 20. An example of such a source of desulfation energy 24 is a desulfation circuit, such as that disclosed in U.S. Pat. No. 5,648,714 titled "METHOD AND DEVICE FOR CHARGING AND CONDITIONING BATTERIES," the entire disclosure of which is incorporated herein by reference.

In other embodiments, the source of desulfation energy 24 may be connected to receive electrical power from an external battery or other power source 25, which may take the form of a vehicle alternator or voltage regulator, instead of or in addition to the battery 18. The desulfator 12 also may include a system control 32 that may take the form of a microcontroller, which in embodiments contains a central processing unit (CPU) or processor core, random access memory (RAM), and read only memory (ROM), programmed to regulate the desulfating voltage and current pulses, as well as the pulse width and amplitude of the pulses of desulfation energy delivered to the battery 18 by the source of desulfation energy 24 of the desulfator 12. In embodiments, the system 10 includes a battery current sensor 26 that may be connected to a cable 28 between the negative battery terminal 22 and vehicle chassis ground 30 of the vehicle 33 on which the system 10 is mounted.

The desulfator 12 of the system 10 may include a battery temperature sensor 34 that may be connected to, as by a probe, or mounted on, the negative battery post 22. The desulfator 12 may include a power regulator 35 that receives power from the battery 18 over cable 20 and provides smooth, conditioned electrical power to the system control 32 and other components of the desulfator. In an exemplary embodiment, the system 10 may be mounted in the vehicle 33, and the vehicle chassis ground 30 connected to the vehicle chassis 36. The vehicle 33 may be selected from a land vehicle, a marine vehicle, an amphibious vehicle, a submarine vehicle, an aircraft, a spacecraft, and/or a stationary engine, and in an internal combustion engine that runs on gasoline, diesel fuel, or natural gas. The term "vehicle 33" also may take the form of a stationary power source.

The system 10 may include a communication controller 38 that is connected to a vehicle communication bus 40 by a cable 42. Vehicle communication bus 40 may take the form of a control area network (CAN) bus or a local interconnect network (LIN). Alternately, or in addition, the communication controller 38, which in embodiments consists of or includes a transceiver, may include a wired or wireless communication connection, indicated by double-headed arrow 43, to a receiver 44. The vehicle communication bus 40 and/or the receiver/transmitter 44 may be connected to the vehicle electronic control unit (ECU) 46 by cables 48, 50, respectively, or wirelessly.

In embodiments, the receiver 44 may be a component of the ECU 46, and/or the communication controller 38 may be a module of the system control 32. The system control 32 may communicate data, such as vehicle battery data, to the ECU 46 from the system control 32 indicative of the condition of the battery 18, which may include one or more of a state of health of the battery, a state of charge of the battery, and a state of function of the battery. In embodiments, the communication controller 38 is programmed to transmit data that is generated by the system control 32 to the ECU 46 over the vehicle communication bus 40.

The system control 32 may include stored operational parameters of the source of desulfation energy 24. Such operational parameters may include voltages triggering activation and deactivation of the source of desulfation energy 24. In an exemplary embodiment, the system control 32 actuates the source of desulfation energy 24 to transmit desulfation energy pulses over the cable 20 to the battery 18 through positive post 16 when the voltage sensor 14 senses a battery voltage of greater than or equal to 13 volts, and deactivates the source of desulfation energy 24 when the battery sensor senses a battery voltage of less than 13 volts.

The communication controller 38 may be programmed to transmit data to the ECU 46 by way of the vehicle communication bus 40 and/or receiver 44 that is responsive to at least one of the voltage data and the current data of the battery 18 collected by the system control 32 from one or more of the voltage sensor 14, the current sensor 26, and the battery temperature sensor 34. Further, the communication controller 38 may be programmed to transmit data to the ECU 46 indicative of the operation of the source of desulfation energy 24. Such data may be shown to a vehicle operator on a display 51 and/or stored in storage 52. The display 51 and storage 52 may be local, namely, mounted on the vehicle 33, and/or located remotely from the vehicle, such as at a location not on the vehicle.

In an embodiment, the communication controller 38 is programmed to receive instructions from ECU 46 over the vehicle communication bus 40 and/or the receiver/transmitter 44 that include operational parameters of the desulfator 12. The operational parameters may include activation and deactivation voltages of the source of desulfation energy 24, pulsation programs for the source of desulfation energy of a predetermined duration, voltage, and pulse width, taking measurements of battery voltage, current, and/or temperature, and predetermined times to actuate the source of desulfation energy and take the measurements. In such an embodiment, the system control 32 may be programmed to receive and store the operational parameters, as well as instructions and commands received from the ECU 46 through the communication controller 38 in a data store 54 that is part of the system control 32.

In an embodiment, the communication controller 38 is a module of the system control 32. In still other embodiments, the system control 32 is programmed to transmit data to the ECU 46 indicative of one or more of a state of health of the battery 18, a state of charge of the battery, and a state of function of the battery. The system control 32 is connected to transmit the data to the display 51 and/or storage 52 connected to receive a display signal or data, respectively from the ECU 46.

In an embodiment, the system control 32 receives data containing predetermined operational parameters of the source of desulfation energy 24 from the ECU 46 through the communication controller 38. In other embodiments, the system control 32 is programmed to monitor the condition of the battery 18 by receiving data indicative of battery voltage from the voltage sensor 14, and in response to apply the pulsation energy from the source of desulfation energy 24 to the battery at a predetermined frequency, for a predetermined time interval, and at a predetermined time, which may be while the vehicle engine is running and/or the ignition is turned on.

Further, the system control 32 may be programmed to monitor the condition of the battery 18, and in response to apply a current pulsation of a predetermined amperage from the source of desulfation energy 24. In embodiments, the system control 32 is programmed to monitor the condition of the battery 18 through one or more of the voltage sensor 14, the current sensor 26, and the battery temperature sensor 34.

In still other embodiments, the system control 32 is programmed to activate the source of desulfation energy 24 and initiate a predetermined desulfation program when the voltage sensor 14 senses a voltage of the battery 18 measured across the terminals 16, 22 that is greater than or equal to a first predetermined voltage, and deactivate the source of desulfation energy when the voltage measured across the battery terminals is less than a second predetermined voltage, all while the vehicle ignition is turned on. The system control 32 may be programmed to communicate battery data through the communication control 38 to the ECU 46 by way of the communication bus 40 or the receiver 44. Battery data may include one or more of the voltage of the battery 18 received from voltage sensor 14, the current flow from the battery received from current sensor 26, and the temperature of the battery received from temperature sensor 34.

In an exemplary embodiment, the system control 32 is programmed to receive data from the communication controller 38 through the communication bus 40 instructing the system control to activate or deactivate the source of desulfation energy 24. The data and instructions come from a user of the vehicle 33, or remotely from an operator over receiver 44. The system control 32 is connected to receive voltage data from the voltage sensor 14 and current data from the current sensor 26 indicative of a condition of the battery 18. The system control 32 also is connected to receive a signal from the voltage sensor 14 and actuate the source of desulfation energy 24 of the desulfator 12.

In an exemplary embodiment, a method for desulfating and communicating a condition of the battery 18 includes sensing a voltage across positive 16 and negative 22 terminals of the battery 18 by the battery voltage sensor 14; and the system control actuating the source of desulfation 24 energy to deliver pulsation energy at predetermined frequencies and durations to the battery. The method further includes measuring the current of the battery 18 by a current sensor 26 connected to the battery between the battery and ground 30; receiving one or more of battery voltage data from the voltage sensor 14, battery current data from the battery current sensor 26, and battery temperature data from that battery temperature sensor 34 indicative of a condition of the battery by the system control 32; actuating the source of desulfation energy 24 of the desulfator 12 by the system control 32; and communicating data to the ECU 46 indicative of the condition of the battery by the communication controller 38 connected to or integral with the system control.

In another exemplary embodiment, a method for making an integrated system 10 for desulfating and communicating a condition of a battery 18 includes connecting to a system control 32 a source of desulfation energy 24 for delivering to a battery pulsation energy at predetermined frequencies and durations, a battery voltage sensor 14, a battery current sensor 26, a battery temperature sensor 34, and a communication controller 38 that can transmit data from the system control and receive data commands for the system control. The method further includes programming the system control 32 to receive data from the battery voltage sensor 14, the battery current sensor 26, and the battery temperature sensor 34, and in response transmit data indicative of a real-time condition of the battery 18 through the communication controller. This data may include data from the system control indicative of one or more of a state of health of the battery, a state of charge of the battery, and a state of function of the battery. The method includes programming the system control 32 to actuate the source of desulfation energy 24 in response to commands received through the communication controller 38 and/or in response to the data from the battery voltage sensor 14 at a predetermined time and for a predetermined duration.

An advantage of the system 10 is that the desulfation signal transmitted to the battery 18 by the source of desulfation energy 24 and transmission of data indicative of the battery 18 condition are controlled by a common system control 32, such as a microcontroller, which in embodiments performs both functions simultaneously. Moreover, the source of desulfation energy 24 and the communication controller 38 are contained within the same desulfator housing 11 as each other, and in embodiments, with the system control 32.

Another advantage of the system 10 is that the communication controller 38 provides two-way communication between the system control 32 and the vehicle communication bus 40, either wirelessly or by a cable 42 connection. Not only does the communication controller 42 send real time data of the condition of the vehicle battery 18, the communication controller receives instructions transmitted to and used by the system control 32 to change the operational parameters of the source of desulfation energy 24 to vary the voltage, amperage, and/or frequency of the desulfation signal sent to the battery 18, as well as the frequency and duration of desulfation pulses and pulse cycles. The system control also receives instructions on the capture, storage and transmission of data indicative of the condition of the battery 18.

While the systems and methods herein described constitute preferred embodiments of this method and system for desulfating and communicating the condition of a battery, it is to be understood that the invention is not limited to these precise forms of apparatus, and that changes may be made therein without departing from the scope of the invention.

What is claimed is:

1. An integrated system for desulfating and communicating a condition of a battery, the system comprising:
   a desulfator that can be connected to the battery, the desulfator including a battery voltage sensor that senses a voltage across a positive terminal and a negative terminal of the battery, a battery current sensor that senses a current of the battery, and a battery temperature sensor that senses a temperature of the battery;
   the desulfator further comprising
      a source of desulfation energy that can be connected to the battery for delivering pulsation energy at predetermined frequencies and durations; and
      a system control for actuating the source of desulfation energy and connected to receive data indicative of a real-time condition of the battery from the voltage across the positive and the negative terminals of the battery sensed by the battery voltage sensor, the current of the battery sensed by the battery current sensor, and the temperature of the battery sensed by the battery temperature sensor, and transmit the data from the battery voltage sensor, the battery current sensor, and the battery temperature sensor indicative of the real-time state of health, state of charge, and state of function of the battery.

2. The system of claim 1, wherein the system control includes stored operational parameters of the desulfator.

3. The system of claim 1, wherein the battery is a vehicle battery, and the system is mounted on a vehicle, wherein the vehicle is selected from a land vehicle, a marine vehicle, a submarine vehicle, an aircraft, a spacecraft, and/or a stationary engine, and in an internal combustion engine that runs on gasoline, diesel fuel, or natural gas.

4. The system of claim 1, wherein the system control is programmed to monitor the current condition of the battery by receiving data indicative of the battery voltage, and in response actuate the source of pulsation energy at a predetermined frequency, for a predetermined time interval, and at a predetermined time.

5. A method for making an integrated system for desulfating and communicating a condition of a battery, the method comprising:
   connecting to a system control a source of desulfation energy for delivering to a battery pulsation energy at predetermined frequencies and durations, a battery voltage sensor, a battery current sensor, a battery temperature sensor, and a communication controller that can transmit data from the system control and receive data for the system control; and
   programming the system control to receive data from the battery voltage sensor, the battery current sensor, and the battery temperature sensor, and in response transmit battery data indicative of a current state of health, state of charge, state of function, voltage of the battery, current from the battery, and temperature of the battery through the communication controller; and
   programming the system control to actuate the source of desulfation energy in response to data commands received through the communication controller and/or in response to the data from the battery voltage sensor at a predetermined time and for a predetermined duration.

6. The method of claim 5, wherein the system control is programmed to activate the source of desulfation energy and initiate a predetermined desulfation program when the voltage sensor senses a battery voltage greater than or equal to a first predetermined voltage, and deactivate the desulfator when the voltage measured across the battery terminals is less than a second predetermined voltage.

7. The method of claim 5, further comprising placing the system control, the communication controller, the source of desulfation energy, and the battery voltage sensor in a desulfator housing.

8. A method for making an integrated system for desulfating and communicating a condition of a battery, the method comprising:
   connecting to a system control a source of desulfation energy for delivering to a battery pulsation energy at predetermined frequencies and durations, a battery voltage sensor, a battery current sensor, a battery temperature sensor, and a communication controller that transmits data from the system control and receives data for the system control; and
   programming the system control to receive data from the battery voltage sensor, the battery current sensor, and the battery temperature sensor, and in response transmit data indicative of a current state of health, state of charge, and state of function of the battery through the communication controller; and
   programming the system control to actuate the source of desulfation energy in response to the data from the battery voltage sensor at a predetermined time and for a predetermined duration.

9. An integrated system for desulfating and communicating a condition of a battery, the system comprising:
   a desulfator that can be connected to the battery, the desulfator including a battery voltage sensor that senses a voltage across a positive terminal and a negative terminal of the battery, a battery current sensor that senses a current of the battery, and a battery temperature sensor that senses a temperature of the battery;
   the desulfator further comprising
      a source of desulfation energy that can be connected to the battery for delivering pulsation energy at predetermined frequencies and durations; and
      a system control for actuating the source of desulfation energy and connected to receive data indicative of a real-time condition of the battery from the voltage across the positive and the negative terminals of the battery sensed by the battery voltage sensor, the current of the battery sensed by the battery current sensor, and the temperature of the battery sensed by the battery temperature sensor, and format and transmit battery data indicative of the condition of the battery.

10. The integrated system of claim 9, wherein the battery data includes a state of health of the battery, a state of charge of the battery, a state of function of the battery, the voltage of the battery, the current flow from the battery, and the temperature of the battery.

11. An integrated system for desulfating and communicating a condition of a battery, the system comprising:
   a desulfator that can be connected to the battery to sense one or more of a voltage across a positive terminal and a negative terminal of the battery, a current of the battery, and a temperature of the battery;
   the desulfator further comprising
      a source of desulfation energy that can be connected to the battery for delivering pulsation energy at predetermined frequencies and durations;
      a system control for actuating the source of desulfation energy and connected to receive data indicative of a real-time condition of the battery from the sensed one or more of the voltage across the positive and the negative terminals of the battery, the current of the battery, and the temperature of the battery, and transmit the data indicative of one or more of the real-time state of health, state of charge, and state of function of the battery; and
      a communication controller that can be connected to a vehicle communication bus, the communication controller receiving the data indicative of the real-time one or more of the state of health, state of charge, and state of function of the battery from the system control and formatting the data to be transmitted over the vehicle communication bus;
   wherein the communication controller is connected to transmit the data indicative of the real-time one or more of the state of health, state of charge, and state of function of the battery to a vehicle electronic control unit (ECU) over the vehicle communication bus.

12. The system of claim 11, wherein the vehicle ECU is connected to a display for displaying the data indicative of the real-time one or more of the state of health, state of charge, and state of function of the battery.

13. The system of claim 11, wherein the vehicle ECU is connected to a data storage for storing the data indicative of the real-time one or more of the state of health, state of charge, and state of function of the battery.

14. The system of claim 11, wherein the communication controller is a transceiver connected to transmit the data indicative of the real-time one or more of the state of health, state of charge, and state of function of the battery wirelessly and/or over the vehicle communication bus to the vehicle ECU.

15. The system of claim 11, wherein the communication controller is connected to receive commands from the vehicle ECU for the system control to do one or more of actuate the source of desulfation energy, take measurements of battery voltage, current, and/or temperature, and a time to actuate the source of desulfation energy and take the measurements.

16. The system of claim 15, wherein the system control includes a data store for storing the data indicative of the real-time one or more of the state of health, state of charge, and state of function of the battery and the commands received from the vehicle ECU.

17. The system of claim 11, wherein the desulfator includes one or more of a voltage sensor to sense the voltage across the positive terminal and the negative terminal of the battery, a current sensor to sense the current of the battery, and a temperature sensor to sense the temperature of the battery.

18. The system of claim 11, wherein the communication controller is programmed to transmit data indicative of an operation of the source of desulfation energy.

19. The system of claim 11, wherein the communication controller is programmed to receive instructions over the vehicle communication bus from the vehicle ECU that include operational parameters of the desulfator.

20. The system of claim 19, wherein the system control is programmed to receive and store the instructions received by the communication controller from the vehicle ECU, the operational parameters including one or more of activation and deactivation voltages of the source of desulfation energy, pulsation programs for the source of desulfation energy of a predetermined duration, voltage, and pulse width, taking measurements of battery voltage, current, and/or temperature, and predetermined times to actuate the source of desulfation energy and take the measurements.

21. The system of claim 11, wherein the communication controller is a module of the system control, and the system control comprises a microcontroller.

22. An integrated system for desulfating and communicating a condition of a battery, the system comprising:
a desulfator that can be connected to the battery, the desulfator including a battery voltage sensor that connects to a battery post of the battery to sense a voltage of the battery;
the desulfator further comprising
a source of desulfation energy that can be connected to the battery for delivering pulsation energy at predetermined frequencies and durations; and
a system control for actuating the source of desulfation energy and connected to receive data indicative of a real-time condition of the battery from at least the voltage of the battery sensed by the battery voltage sensor and transmit battery data of the battery, wherein the battery data includes a state of health of the battery, a state of charge of the battery, a state of function of the battery, the voltage of the battery, a current flow from the battery, and a temperature of the battery.

\* \* \* \* \*